(12) United States Patent
Li et al.

(10) Patent No.: US 11,757,421 B2
(45) Date of Patent: Sep. 12, 2023

(54) CIRCUIT AND METHOD FOR AN ELECTRICAL FILTER

(71) Applicant: GE Aviation Systems LLC, Grand Rapids, MI (US)

(72) Inventors: Cong Li, Schenectady, NY (US); Han Xiong, Schenectady, NY (US); Xiaochuan Jia, Centerville, OH (US); David Dimitri Karipides, Casstown, OH (US); Ren Xie, Schenectady, NY (US)

(73) Assignee: GE Aviation Systems LLC, Grand Rapids, MI (US)

( * ) Notice: Subject to any disclaimer, the term of this patent is extended or adjusted under 35 U.S.C. 154(b) by 0 days.

(21) Appl. No.: 17/464,285

(22) Filed: Sep. 1, 2021

(65) Prior Publication Data
US 2023/0061575 A1 Mar. 2, 2023

(51) Int. Cl.
*H03H 7/01* (2006.01)
*H03H 3/00* (2006.01)

(52) U.S. Cl.
CPC ................ *H03H 7/0115* (2013.01); *H03H 3/00* (2013.01)

(58) Field of Classification Search
CPC ............... H03H 3/00; H03H 7/0115
USPC ....................................................... 333/175
See application file for complete search history.

(56) References Cited

U.S. PATENT DOCUMENTS

| 7,135,643 | B2 | 11/2006 | van Haaster et al. |
| 8,115,117 | B2 | 2/2012 | Kapusta et al. |
| 8,564,092 | B2 | 10/2013 | Burgyan et al. |
| 2005/0036262 | A1 | 2/2005 | Siebenthall et al. |
| 2013/0200961 | A1* | 8/2013 | Bianchi ............... H03H 7/0123 333/175 |

FOREIGN PATENT DOCUMENTS

| CN | 103390484 | A | 11/2013 |
| CN | 104270111 | A | 1/2015 |
| EP | 0761842 | B1 | 3/1999 |
| KR | 101890023 | B1 | 8/2018 |
| WO | 0186774 | A1 | 11/2001 |

* cited by examiner

*Primary Examiner* — Rakesh B Patel
(74) *Attorney, Agent, or Firm* — McGarry Bair PC

(57) ABSTRACT

An electrical filter circuit is disclosed. The circuit includes a first input line and a second input line. A first transmission line is coupled electrically in series at a first node with a first output line, and an inductor is coupled electrically in series between the first input line and the first transmission line. The filter also includes a second transmission line having a first impedance coupled to the first node. The second input line is coupled electrically in series at a second node with a second output line. A third transmission line is coupled to the second node, and a capacitor is coupled electrically in series between the second transmission line and the third transmission line. The first output line has a second impedance that is greater than the first impedance.

18 Claims, 8 Drawing Sheets

CIRCUIT AND METHOD FOR AN ELECTRICAL FILTER

TECHNICAL FIELD

This invention relates generally to electrical filter circuits electrical filtering techniques and more particularly to the application of such techniques to power electronic circuits.

BACKGROUND

High-speed switching devices have enabled increased switching frequencies for voltage-source pulse width modulated (PWM) inverters and DC-DC converters, leading to improved operating characteristics. High-speed switching techniques, however, present some drawbacks as a consequence of a faster rate-of-change in the voltage associated with the high-speed switching.

Due to the switching frequencies of solid-state switches used in the operation of power electronic circuits, a desirable low-frequency current and an undesirable high-frequency ripple current will flow in the circuit. To reduce the high-frequency ripple currents provided to a load, some conventional systems employ various chokes and filters. Such passive filters, are commonly referred to as "LC filters" because they typically employ an inductor (L) and a capacitor (C) coupled to ground in the AC input line to attenuate the ripple current. For example, a low-pass LC filter (e.g., an inductor coupled to a capacitor) is typically used to allow the flow of low-frequency current while reducing high-frequency ripple current to the load.

The foregoing and still further objects and advantages of the present disclosure will be more apparent from the following detailed explanation of the preferred aspects of the disclosure in connection with the accompanying drawings.

BRIEF DESCRIPTION OF THE DRAWINGS

A full and enabling disclosure of the present description, including the best mode thereof, directed to one of ordinary skill in the art, is set forth in the specification, which refers to the appended FIGS., in which.

DETAILED DESCRIPTION

Figure 1:
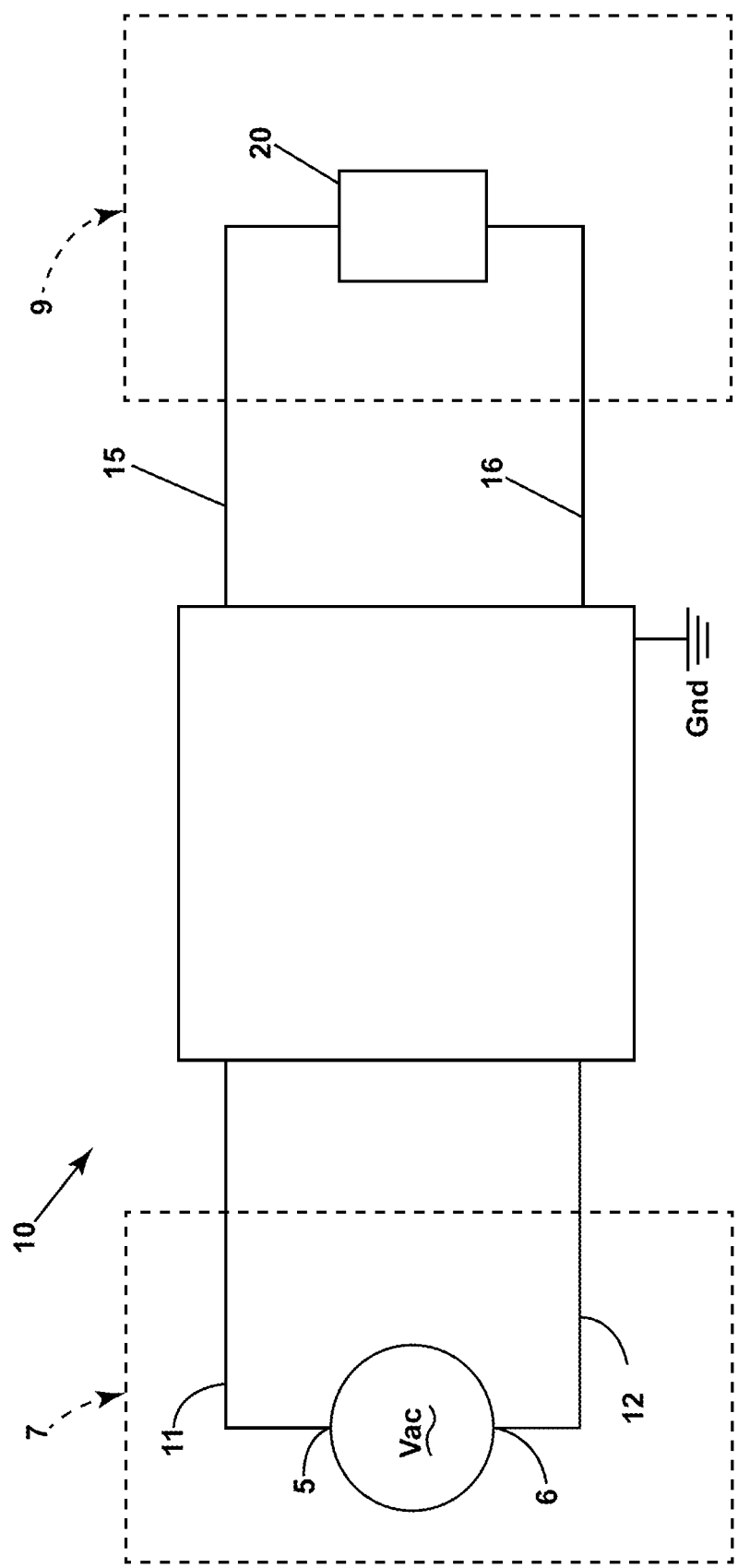
FIG. 1 depicts a schematic view of a prior art filter circuit.

Aspects of the disclosure can be implemented in any environment, apparatus, or method for an electrical filter regardless of the function performed by the apparatus or method.

As used herein, the term "upstream" refers to a direction that is opposite the current flow direction, and the term "downstream" refers to a direction that is in the same direction as the current flow. Accordingly, an "upstream" end of an element will be opposing a "downstream" end of the element. Additionally, while terms such as "voltage", "current", and "power" can be used herein, it will be evident to one skilled in the art that these terms can be interrelated when describing aspects of the electrical circuit, or circuit operations.

Connection references (e.g., attached, coupled, connected, and joined) are to be construed broadly and can include intermediate members between a collection of elements and relative movement between elements unless otherwise indicated. As such, connection references do not necessarily infer that two elements are directly connected and in fixed relation to each other. In non-limiting examples, connections or disconnections can be selectively configured to provide, enable, disable, or the like, an electrical connection between respective elements. Additionally, as used herein, "electrical connection" or "electrically coupled" can include a wired or wireless connection. The exemplary drawings are for purposes of illustration only and the dimensions, positions, order and relative sizes reflected in the drawings attached hereto can vary.

As used herein, conventional terms such as electrical "resistivity", "resistance", "impedance", and inductance refer to fundamental properties or electrical characteristics of a material that quantify how strongly the material resists electric current under certain conditions. Likewise, as used herein, conventional terms such as electrical "conductance" "conductivity" or "admittance" refer to fundamental properties or electrical characteristics of a material that quantify how well the material conducts electricity under certain conditions. It will be appreciated that electrical conductivity is the reciprocal of electrical resistivity, and electrical admittance is the reciprocal of electrical impedance. For example, it will be understood that as used herein, the "electrical resistance" of an electrically conductive material is a relative measure of the material's opposition to the flow of electric current, and the reciprocal quantity of the electrical resistance is electrical conductance. As used herein, "electrical conductance" is an electrical characteristic of a material describing the relative ease with which an electric current can pass through the electrically conductive material under various conditions. In some cases, the electrical resistivity and electrical conductance of a material can depend on the frequency of the electric current. It will be further understood that as used herein, "inductance" is a relative measure of the tendency of an electrically conductive material to oppose a change in the electric current flowing through it (for example, due to the magnetic field around the conductive material created by the current under various conditions.

As used herein, the term "transmission line", or simply "line", refers to a conductor or other conductive structure operative to conduct electrical current in a contained manner between discrete devices or electrical components within an electrical circuit. Non-limiting examples of transmission lines can include wires, cables, busbars, printed circuit board traces, or combinations thereof, used to electrically couple discrete electrical components, such as devices mounted on a printed circuit. The term "transmission line" is not intended to be so broadly construed as to include the discrete components themselves, such as resistors, capacitors, inductors, switches, semiconductor devices, and the like.

Although capacitors and inductors can each have inherent electrical noise filtering capabilities, they are often used in combination to achieve desired or enhanced levels electrical noise reduction. As used herein, the term "LC filter" or "LC filter circuit" can refer to an electrical filter circuit consisting of a combination of an inductor (L) and a capacitor (C) to one of reduce or conduct specific frequency bands of an electric signal. For example, conventional LC filter circuits can define a low-pass filter that can conduct DC and predetermined low-frequency signals while reducing or attenuating predetermined high-frequency signals to a load. The attenuation or insertion loss, as a figure of merit, for a filter circuit is typically expressed as a ratio of the signal level without the filter installed to the signal level with the filter installed. and is conventionally described in decibels (dB).

A conventional filter circuit 10 is illustrated in FIG. 1. The filter circuit 10 has an input side 7 comprising a first input line 11 and a second input line 12 arranged in parallel. The filter circuit 10 also has an output side 9 comprising a first output line 15 and a second output line 16 arranged in parallel to provide an output voltage to a load 20. For example, the first and second input lines 11, 12 can comprise a respective transmission line such as a wire, cable, busbar, or printed circuit board (PCB) trace. An AC voltage source (designated "Vac"), having a first source terminal 5 and a second source terminal 6 defining a source voltage therebetween, can be coupled in signal communication with the input side 7 of the filter circuit 10 to provide a voltage thereto. For example, the first input line 11 can be coupled to the first source terminal 5, and the second input line 12 can be coupled to the second source terminal 6. The filter circuit 10 typically comprises an inductor (not shown) coupled in series to the first input line 11. A downstream end of the inductor (not shown) can be coupled to the first output line 15. A capacitor (not shown) is coupled via a second transmission line 17 to the first output line 15. The capacitor can be a shunt capacitor in parallel with the output side 9, and arranged between the downstream end of the inductor and ground. In conventional filter circuits 10, all of the input lines 11, 12 transmission lines 17, 18 and output lines 15, 16 are typically copper conductors having essentially identical impedances. For example, each transmission line can comprise a respective conventional copper trace on a PCB. The conventional transmission lines used in a typical filter circuit 10 typically employ impedance matching of the conductors to conduct electromagnetic signals with minimal reflections and power losses. For example, to prevent reflections, typical transmission lines used in a conventional circuit 10 have uniform cross-sectional dimensions along their length, giving them a uniform impedance, called the characteristic impedance.

However, the effectiveness of conventional filter circuits 10 to filter electrical noise can depend on the magnitude of the filter impedance with respect to the load or output impedance. For example, even if a capacitor having a low impedance is used in parallel with the load 20 to shunt high-frequency noise to ground, a high-frequency noise signal can still flow to the load 20 if the output impedance is lower than the filter impedance. Accordingly, conventional filter circuits 10 will employ larger or more numerous discrete high devices (e.g., resistors, inductors) to add additional output impedance, or to reduce the relative impedance of the capacitor with respect to the output impedance. However, adding discrete resistors or other high impedance discrete devices or components to the output (e.g., to the output lines 15, 16) of a conventional filter circuit 10 to increase the relative output impedance can add considerable cost. Moreover, such additional discrete components can also add undesired weight to the filter circuit 10, and further require additional volumetric space that may be otherwise unavailable.

Figure 2:
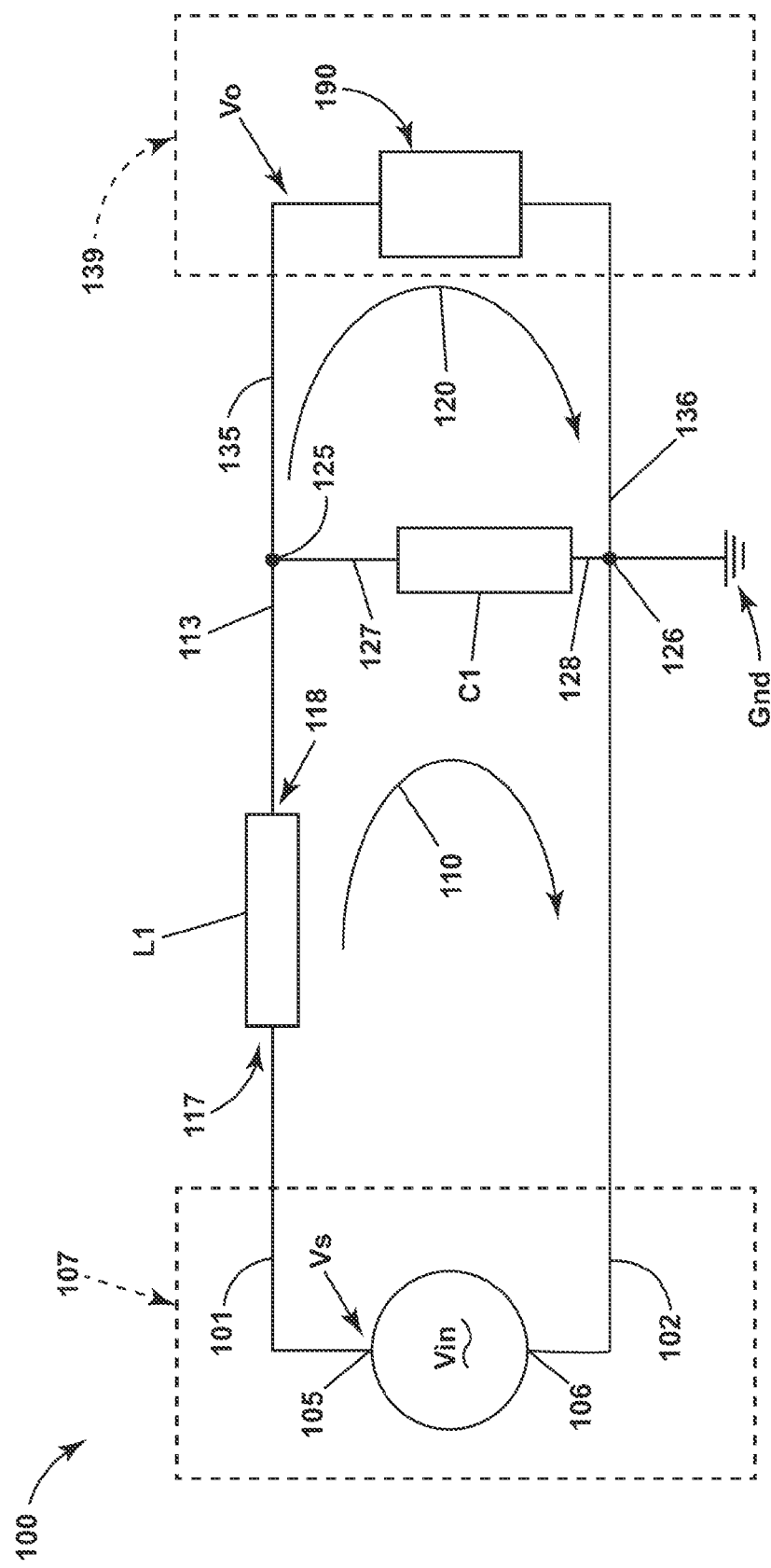
FIG. 2 depicts a filter circuit in a single-phase AC system in accordance with various aspects described herein.

FIG. 2 depicts, in schematic form, a filter circuit 100 in accordance with a non-limiting aspect. The filter circuit 100 can have an input side 107 comprising conductive first input line 101 and a conductive second input line 102 arranged electrically in parallel. For example, the first and second input lines 101, 102 can comprise, without limitation, a respective power line such as a wire, cable, busbar, or printed circuit board (PCB) trace. The filter circuit 100 can also have an output side 139 comprising a conductive first output line 135 and a conductive second output line 136 arranged in electrically in parallel. The output side 139 can be electrically coupled to a load 190. An AC voltage source (designated "Vin"), having a first source terminal 105 and a second source terminal 106 defining a source voltage Vs therebetween, can be coupled in signal communication with the input side 107 of the filter circuit 100 to provide the source voltage Vs thereto. For example, the first input line 101 can be electrically coupled to the first source terminal 105, and the second input line 102 can be electrically coupled to the second source terminal 106. The second input line 102 can be electrically coupled to a ground potential, designated "GND". In an aspect, the second output line 136 can be electrically coupled to the ground GND. For example, AC voltage source Vin can provide the source voltage Vs as an input to the filter circuit 100 as a conventional AC differential mode voltage with respect to ground (GND) or neutral, and having any desired frequency. The filter circuit 100 can filter or modify the source voltage Vs and provide the filtered voltage as an output voltage Vo to the load 190.

The filter circuit 100 can comprise an inductor (designated L1) coupled electrically in series at a upstream end 117 with the first input line 101. A conductive first transmission line 113 can couple a downstream end 118 of the inductor L1 electrically in series with the first output line 135. A capacitor C1 can be coupled via a conductive second transmission line 127 to the first transmission line 113. As can be seen in FIG. 2, the first transmission line 113, the second transmission line 127 and the first output line 135 can be electrically coupled together to define a first node 125. The capacitor C1 can be arranged as a shunt capacitor C1 in parallel with the output side 190, and coupled between the downstream end 118 of the inductor L1 (i.e., at the first node 125) and the ground GND. For example, the capacitor C1 can be coupled to ground GND via a third transmission line 128. In such an aspect, the third transmission line 128, the second input line 102 and the second output line 136 can be coupled together to define a second node 126. In non-limiting aspects, the capacitor C1 can be coupled in series directly to the first node 125 and the second node 126.

The filter circuit 100 can be configured to define a first current path (designated "110") and a second current path (designated "120"), relative to the first node 125. For example, as depicted in FIG. 2, the first current path 110 can extend from the first transmission line 113 to the first node 125, and then to the second transmission line 127 to the capacitor C1 to the third transmission line 128 to ground GND. The second current path 120 can extend from the first transmission line 113 to the first node 125, and then to the first output line 135 to the load 190 to the second output line 136 to ground GND. As will be described in more detail herein, in an aspect, the first output line 135 can be configured to be less conductive (i.e., have a higher impedance) than the second transmission line 127. Additionally, or alternatively, in other aspects, the second output line 136 can be configured to be less conductive (i.e., have a higher impedance) than the second input line 102. In such aspects, the second current path 120 can define a higher impedance conductive path than the first current path 110. As will be further described herein, in non-limiting aspects, at least one of the respective conductivity, admittance, resistance, impedance, and inductance, of the first output line 135 and second output line, 136, second input line 102, the first transmission line 113, second transmission line 127, and third transmission line 128 can be respectively arranged or configured based on the respective material, or structure, or both, of each line. As will be discussed in more detail herein, the arrangement and selection of the conductive material used to form the conductive lines of the filter circuit 100 can serve the particular purpose of configuring the respective relative impedances of the current paths 135, 136, 102, 113, 127, 128 to direct relatively higher frequency currents (e.g. harmonic frequency currents) to flow through desired filter paths to ground, and thereby enable the use of smaller, lighter filter components (e.g., inductor L1, capacitor C1) over conventional filter circuits.

It will be understood that, while the FIG. 2 depicts the filter circuit 100 as a simple single-phase AC circuit for ease of description and understanding, other aspects are not so limited. It is contemplated that other non-limiting aspects of the filter circuit can comprise any desired number of AC electrical phases (e.g., a conventional three-phase AC voltage), comprising any desired number of AC input lines, having any desired number of phase and frequency orientations, on any number of desired input lines 101, 102 without departing from aspects of the disclosure herein. It will be further understood that the illustrated aspect of FIG. 2 is only one non-limiting example of a filter circuit 100, and many other possible aspects, configurations, or the like, in addition to that shown are contemplated by aspects of the present disclosure. It will be further understood that while aspects of the disclosure are shown, for ease of understanding, in the simple arrangement shown in FIG. 2, depicting a single power source Vin, the disclosure is not so limited and has general application to electrical power systems or filter circuits 100 having any number of power sources Vin without departing from the scope of the disclosure.

Figure 3:
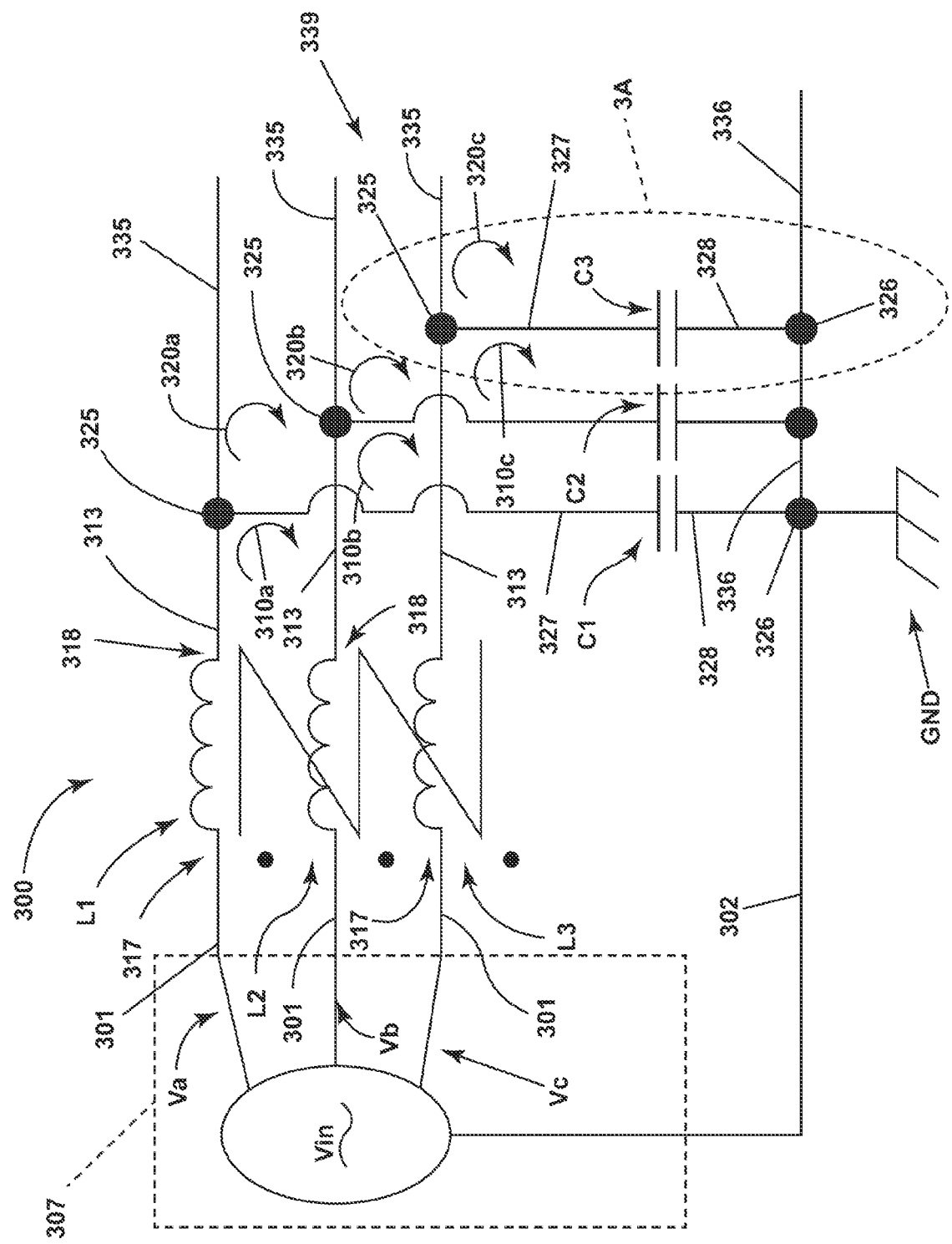
FIG. 3 depicts a filter circuit in a polyphase AC system in accordance with various aspects described herein.

FIG. 3 illustrates a non-limiting aspect of a variant of the filter circuit 100 of FIG. 2. Accordingly, like parts in the schematic of FIG. 3 are identified with the same reference numbers as in FIG. 2, incremented by 200. More specifically, FIG. 3 depicts a three-phase AC electrical filter circuit 300.

The filter circuit 300 can have an input side 307 comprising a set of conductive first input lines 301 and a conductive second input line 302. Each first input line 301 can be arranged electrically in parallel with the second input line 302. The filter circuit 300 can also have an output side 339 comprising a set of conductive first output lines 335 arranged electrically in parallel, and a conductive second output line 336. Each first output line 335 can be further arranged in electrically in parallel with the second output line 336. The output side 339 can be electrically coupled to a load (not shown). AC electrical power can be provided as an input from a polyphase AC voltage source Vin on the input side 307 of the filter circuit 300. For example, as depicted in FIG. 3, the AC voltage source Vin can be a conventional three-phase AC power supply configured to provide a three-phase differential mode voltage (phases denoted Va, Vb, and Vc), with respect to ground (GND) or neutral, and having any desired frequency. Each phase voltage Va, Vb, Vc can be provided to the filter circuit 300 on a respective first input line 301. In this way, each respective first input line 301 can correspond to a respective phase voltage of the filter circuit 300.

For example, a respective first input line 301 can be electrically coupled to receive a respective phase voltage Va, Vb, Vc from the voltage source Vin, and the second input line 302 can be electrically coupled the ground potential, designated "GND".

The filter circuit 300 can comprise a set of inductors (designated "L1", "L2", and "L3") each being coupled electrically in series at a respective upstream end 317 with a respective first input line 301. A set of first transmission lines 313 can couple a respective downstream end 318 of each inductor L1, L2, L3 electrically in series with a respective first output line 335. A set of capacitors (designated "C1", "C2", and "C3") can be coupled via a respective second transmission line 327 to a respective first transmission line 313. As can be seen in FIG. 3, each respective first transmission line 313, respective second transmission line 327, and respective first output line 335 can be electrically coupled together to define a respective first node 325. Each capacitor C1, C2, C3 can be arranged as a shunt capacitor C1, C2, C3 in parallel with the output side 339, and coupled between the respective downstream end 318 of each respective inductor L1, L2, L3 (i.e., at the respective first node 325), and the ground GND. For example, each capacitor C1, C2, C3 can be coupled to ground GND via a respective third transmission line 328. In such an aspect, each respective third power transmission line 328, the second input line 302, and the second output line 336 can be coupled together to define a respective second node 326. Each respective first output line 335 can correspond to a respective phase voltage Va, Vb, Vc of the filter circuit 300.

The filter circuit 300 can be configured to define a set of first current paths (designated "330a", "330b", and "330c") and a set of second current path (designated "320a", "320b", and "320c"), relative to a respective first node 325. For example, as depicted in FIG. 3, the respective first current paths 310a, 310b, 310c can each comprise a respective conductive path extending from a respective first power transmission line 313 to a respective first node 325, and then to a respective second transmission line 327 to a respective capacitor C1, C2, C3, and then to a respective third transmission line 328 to ground GND. The set of second current paths 320a, 320b, and 320c can respectively comprise another current path extending from the respective first power transmission line 313 to the respective first node 325, and then to the respective first output line 335 to the load (not shown), and then to the second output line 336 to ground GND. As will be described in more detail herein, in an aspect, the respective first output lines 335 can be configured to have a lower conductance (e.g., a higher impedance), or a higher inductance, or both, than the corresponding second transmission lines 327. Additionally, or alternatively, in other aspects, the second output line 336 can be configured to have a lower conductance, (e.g., a higher impedance), or a higher inductance, or both, than the second input line 302. In such aspects, the second current paths 320a, 320b, 320c can each define a lower conductance or higher inductance conductive path than the corresponding first current paths 310a, 310b, 310c.

Figure 3A:
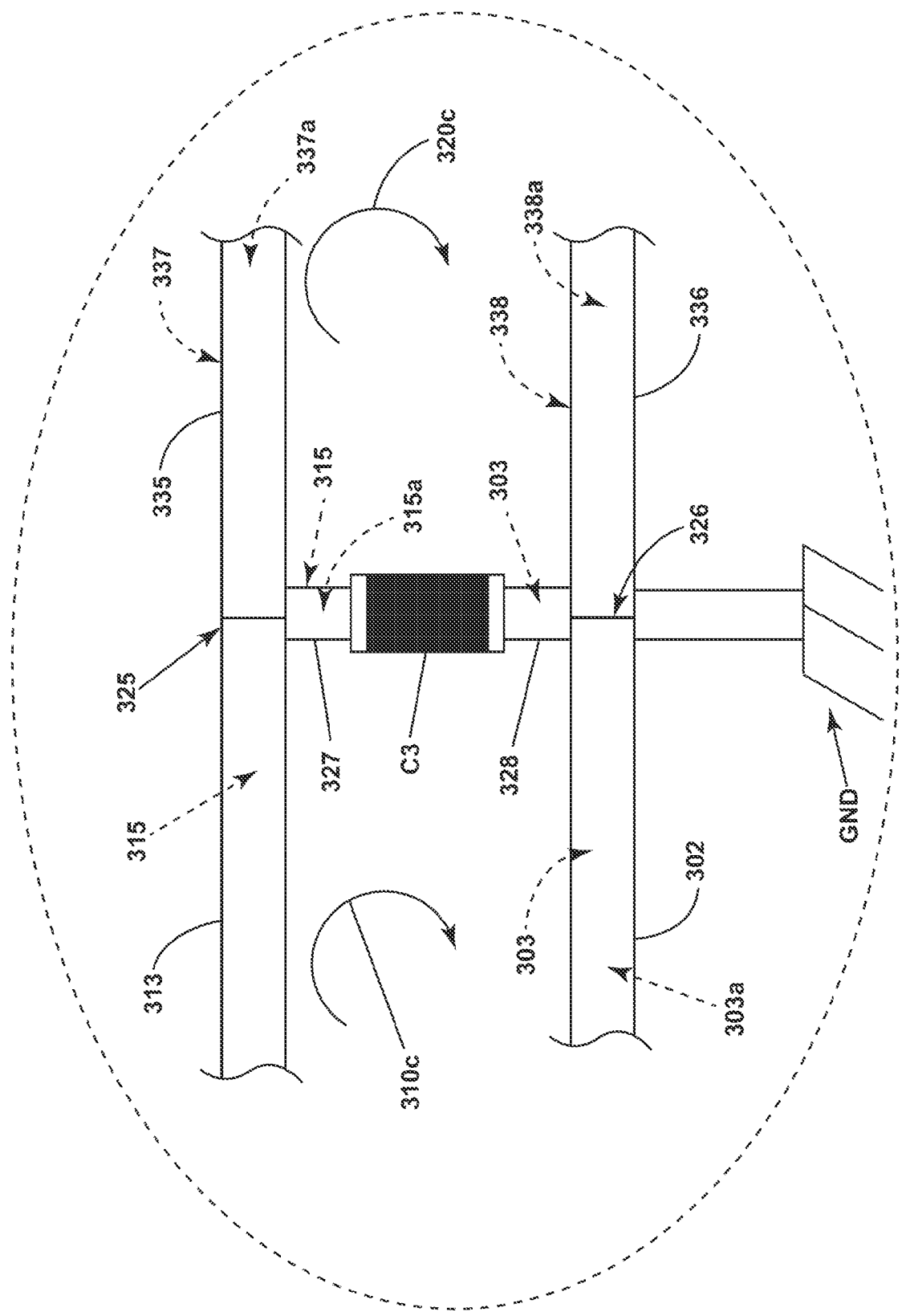
FIG. 3A depicts a more detailed view of a portion of the filter circuit of FIG. 3.

FIG. 3A illustrates a more detailed schematic view of a portion of the filter circuit of FIG. 3. That is, for ease of description and understanding, FIG. 3A depicts a portion of a single phase leg of the three-phase filter circuit 300. It will be appreciated that the description of FIG. 3A can apply mutatis mutandis to the corresponding other phase leg portions of the filter circuit 300.

In a non-limiting aspect, the first output line 335 can be formed of a first material 337 having a first electrical characteristic 337a. The second transmission line 327 can be formed of a second material 315 having a second electrical characteristic 315a. In non-limiting aspects, the first electrical characteristic 337a and the second electrical characteristic 315a can be one or more of a respective resistance, conductance, impedance, or inductance. In non-limiting aspects, the second material 315 can be different than the first material 337. In non-limiting aspects, the first transmission line 313 can also be formed of the second material 315. In some non-limiting aspects, the second material 315 can be more electrically conductive (e.g., have a lower impedance) than the first material 337. In this example, a first electrical characteristic 337a (e.g., the impedance) of the first material 337 can be greater than the second electrical characteristic 315a (e.g., the impedance) of the second material 315. In other non-limiting aspects, the second material 315 can be less electrically inductive (i.e., have a lower inductance) than the first material 337. For example, in non-limiting aspects, the second material 315 can be a copper alloy, and the first material 337 can be a nickel alloy.

In non-limiting aspects, the second input line 302 can be formed of a third material 303 having a third electrical characteristic 303a, and the second output line 336 can be formed of a fourth material 338 having a fourth electrical characteristic 338a. In non-limiting aspects, the third electrical characteristic 303a and the fourth electrical characteristic 338a can be one or more of a relative resistance, conductance, impedance, or inductance. In some aspects, the third transmission line 328 can be formed of the third material 303. In non-limiting aspects, the third material 303 can be different than the fourth material 338. For example, in some non-limiting aspects, the third material 303 can be more electrically conductive (e.g., have a lower impedance) than the fourth material 338. In this example, the third electrical characteristic 303a (i.e., the impedance) of the third material 303 can be lower than the fourth electrical characteristic 338a (i.e., the impedance) of the fourth material 338. For example, in non-limiting aspects, the third material 303 can be a copper alloy, and the fourth material 338 can be a nickel alloy.

In non-limiting aspects, as depicted in FIG. 3A, the first current path 310c can comprise a current path extending from the first node 325, and then to the second transmission line 327 to the capacitor C3, then to the third power transmission line 328, and then to ground GND. The second current path 320c can comprise another current path extending from the first node 325, and then to the first output line 335 to the load (not shown), then to the second output line 336, and then to ground GND. In non-limiting aspects, due to the lower conductivity (e.g., higher impedance) or higher inductance, or both, of the first material 337, the fourth material 338, or both, (with respect to the respective conductivity or inductance of the second material 315, third material 303 or both) the second current path 320c can define a conductive path having a higher impedance, or higher inductance, or both than the impedance of the first current path 310c.

The arrangement and selection of the respective conductivity or inductance of the first material 337 and fourth material 338, with respect to the respective conductivity or inductance of the second material 315, and third material 303, can serve the particular purpose of configuring the respective relative impedances of the first current path 310c and second current path to direct more of the relatively higher frequency currents (e.g. harmonic frequency currents) to flow through the first current path 310c than the second current path 320c. This can enable the use of smaller, lighter filter components (e.g., inductor L3, capacitor C3) over conventional filter circuits.

Additionally, as is well known, electrical current in a circuit flows in a path that results in the lowest expenditure of energy. For example, at lower frequencies, current generally flows in a path that is of the shortest distance. However, in contrast, due at least in part to proximity effects, at higher frequencies, current flow can take the path of the lowest inductance, that is, the path of smallest loop area. Consequently, the current at high frequencies tends to be concentrated along the surfaces of the conductors forming the current path. That is, the high-frequency current does not generally flow evenly throughout the entire cross-section of a conductor but can be more concentrated at the surface.

Figure 4:
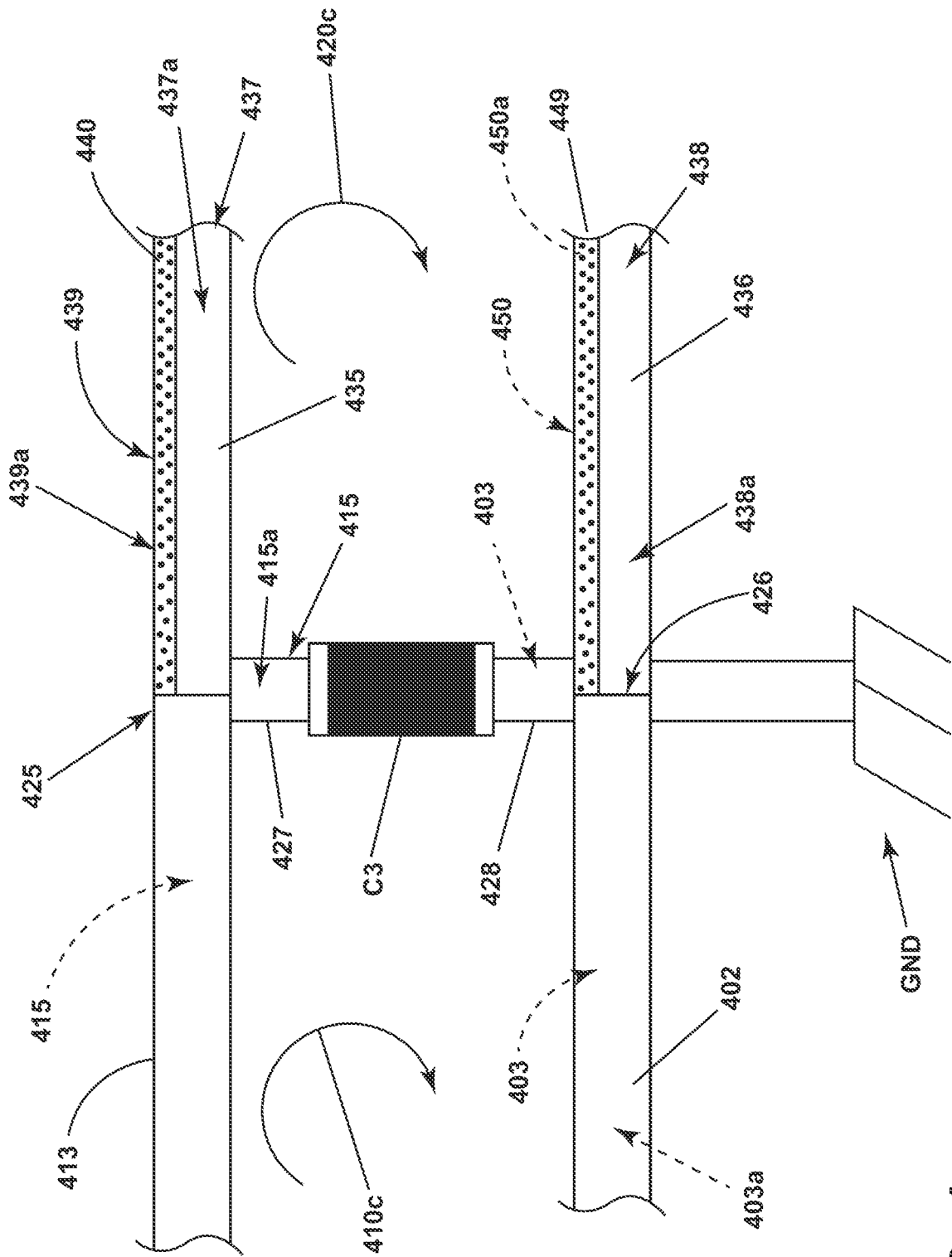
FIG. 4 depicts a portion of a non-limiting aspect of the filter circuit of FIG. 3, in accordance with various aspects described herein.

For example, FIG. 4 depicts, in schematic form, another non-limiting aspect of a single phase leg portion of the filter circuit depicted in FIGS. 3 and 3A. For ease of description and understanding, FIG. 4 depicts only a portion of the 3-phase filter circuit 300. It will be appreciated that the description of FIG. 4 would apply mutatis mutandis to the corresponding other phase leg portions of the filter circuit 300. Accordingly, like parts in the schematic illustration of FIG. 4 are identified with the same reference numbers as in FIG. 3A, incremented by 100.

In the non-limiting aspect illustrated in FIG. 4, the first output line 435 can be formed of the first material 437, and the second transmission line 427 can be formed of the second material 415. In some non-limiting aspects, the first transmission line 413 can also be formed of the second material 415. The first output line 435 can further comprise a conductive fifth material 439 having a fifth electrical characteristic 439a deposited on a surface thereof to define a conductive first layer 440. In some aspects, the conductive first layer 440 can be a peripheral layer. In non-limiting aspects, the conductive fifth material 439 can be less electrically conductive (e.g., have a greater impedance), or more inductive, or both, than the first material 437. In some aspects, the first material 437 can be the same material as the second material 415, or have the same electrical conductivity as the second material 415, while the fifth material 439 is less electrically conductive, or more inductive, or both, than the second material 437. In this sense, fifth material 439 can provide a higher impedance or a more inductive path along the first output line 435 for high-frequency currents than along the second transmission line 427. In non-limiting aspects, the fifth material 439 can be deposited on the second material 437 using any desired deposition, plating, or 3-D printing method, or combinations thereof. The conductive first layer 440 can thus be configured to provide any desired impedance (e.g., along the surface) or inductance, or both of the first output line 435. In other non-limiting aspects, the first layer 440 can be defined internal, e.g., an internal conductive first layer 440 to the first material 437. In non-limiting aspects, the fifth material 439 can include without limitation any one of aluminum alloy, nickel alloy, iron alloy, etc.

While FIG. 4 depicts, for ease of description and understanding, the fifth material 439 as being deposited on a single surface of the first output line 435, other aspects are not so limited. It is contemplated that the fifth material 439 can be deposited on one surface, some surfaces, or all surfaces of the first output line 435 without departing from the scope of the disclosure. In other non-limiting aspects, the conductive first layer 440 can be beneath a peripheral surface of the first output line 435.

In other non-limiting aspects, third transmission line 428 can be formed of the conductive third material 403 having the third electrical characteristic 403a, and the second output line 436 can be formed of the conductive fourth material 438 having the fourth electrical characteristic 438a. The second output line 436 can further have a conductive sixth material 450 having a sixth electrical characteristic 450a, deposited on a surface thereof to define a conductive second layer 449. In non-limiting aspects, the conductive sixth material 450 can be less electrically conductive than the fourth material 438. For example, the impedance of the sixth material 450 can be greater than the impedance of the fourth material 438. In some aspects, the fourth material 438 can be the same material as the second material 415, or have the same electrical conductivity as the second material 415, while the sixth material 450 is electrically less conductive than the fourth material 438. In this sense, because the impedance of the sixth material 450 is greater than the impedance of the third material 403, the sixth material 450 can provide a higher impedance path along the second output line 436 for high-frequency electrical currents than along the third transmission line 428.

In non-limiting aspects, the sixth material 450 can be deposited on the fourth material 438 using any desired deposition, plating, or 3-D printing method, or combinations thereof. The conductive second layer 449 can thus be configured to provide any desired inductance or impedance, or both, (e.g., along the surface) of the second output line 436. In other non-limiting aspects, the conductive second layer 440 can be an internal layer, such as an internal conductive second layer 449 defined within the fourth material 438. In non-limiting aspects, the sixth material 450 can include without limitation any one of aluminum alloy, nickel alloy, iron alloy, etc.

The conductive second layer 449 can thus be configured to provide any desired conductance, impedance, or inductance along the periphery (e.g., along the surface) of the second output line 436. In other non-limiting aspects, the conductive second layer 440 can be defined internal, (e.g., an internal conductive second layer 440 defined within the conductive fourth material 438.

In non-limiting aspects, as depicted in FIG. 4, the first current path 410c can comprise a current path extending from the first node 425, and then to the second transmission line 427 to the capacitor C3, then to the third transmission line 428, and then to ground GND. The second current path 420c can comprise another current path extending from the first node 425, and then to the first output line 435 to the load (not shown), then to the second output line 436, and then to ground GND. For example, due to the lower conductivity (i.e., higher impedance) or greater inductance of the conductive first layer 440, the first material 437, or both, (with respect to the respective conductivity, impedance, or inductance of the second material 415, third material 403 or both) the second current path 420c can define a conductive path having a higher impedance, or greater inductance, or both, than the first current path 410c.

The arrangement and selection of the respective conductivity or inductance of the first material 437 and third material 403, with respect to the respective conductivity or inductance of the fifth material 439, can serve the particular purpose of configuring the respective relative impedances of the first current path 410c and second current path 420c to direct more of the relatively higher frequency currents (e.g. harmonic frequency currents) to flow through the first current path 410c than the second current path 420c. Similarly, the arrangement and selection of the respective conductivity or inductance of the fourth material 438, third material 403, and second material 415, with respect to the respective conductivity or inductance of the sixth material 450, can serve the particular purpose of configuring the respective relative impedances of the first current path 410c and second current path 420c to direct more of the relatively higher frequency currents (e.g. harmonic frequency currents) to flow through the first current path 410c than the second current path 420c. This can enable the use of smaller, lighter filter components (e.g., inductor L3, capacitor C3) over conventional filter circuits.

Figure 5:
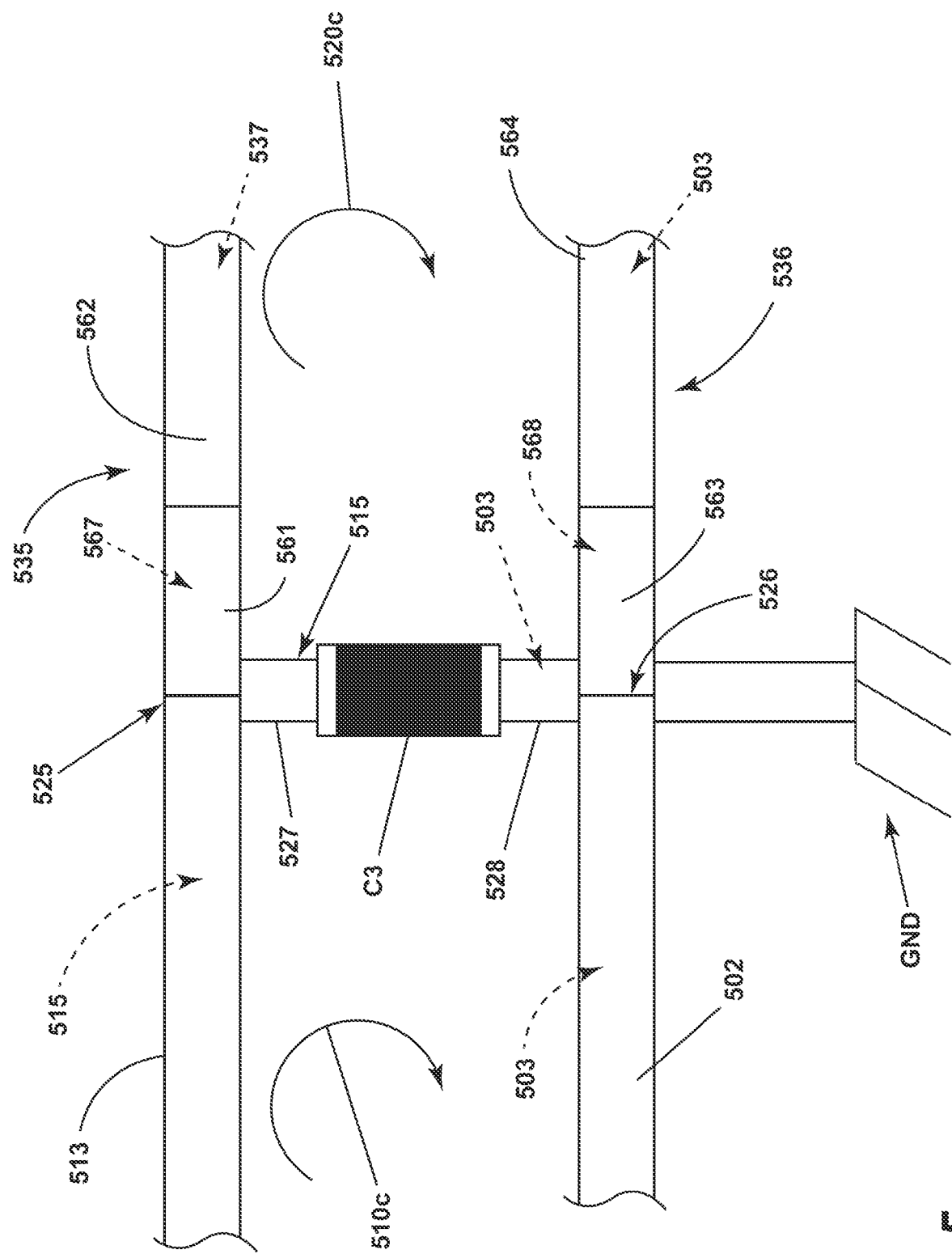
FIG. 5 depicts a portion of another non-limiting aspect of the filter circuit of FIG. 3, in accordance with various aspects described herein.

FIG. 5 depicts, in schematic form, another non-limiting aspect of a single phase leg portion of the filter circuit 300 depicted in FIGS. 3 and 3A. It will be appreciated that the description of FIG. 5 would apply mutatis mutandis to the corresponding other phase leg portions of the filter circuit 300. Accordingly, like parts in the schematic illustration of FIG. 4 are identified with the same reference numbers as in FIG. 3A, incremented by 200.

In the non-limiting aspect illustrated in FIG. 5, the second transmission line 527 can be formed of the second material 515. In some non-limiting aspects, the first transmission line 513 can also be formed of the second material 515. The first output line 535 can comprise a first segment 561 and a second segment 562 connected electrically in series. In an aspect, the first segment 561 can be formed of a conductive seventh material 567 having a seventh electrical characteristic 567a (e.g., an impedance). In non-limiting aspects, the second segment 562 can be formed of the conductive first material 537 having the first electrical characteristic 537a (e.g., an impedance). In aspects, the impedance of the seventh material 567 can be greater than the impedance of the first material 537. For example, the seventh material 567 forming the first segment 561 can be less conductive than the first material 537. In other aspects, the seventh material 567 can be more inductive than the first material 537. In some aspects, the first material 537 can be the same material as the second material 515, or have the same electrical conductivity as the second material 515. Regardless of the conductive material forming the second segment 562, the seventh material 567 forming the first segment 561 can be less electrically conductive, or more inductive, or both, than the material forming the second segment 562. In non-limiting aspects, the first output line 535 can comprise the first output line segment 561 formed of the seventh material 567 having a first impedance, and a second output line segment 562 formed of a material having a second impedance, wherein a sum of the first impedance and the second impedance is greater than the impedance of at least one of the second transmission line 527 and the third transmission line 528. For example, in aspects, the first output line 535 can comprise the first output line segment 561 formed of the seventh material 567 having the first impedance, and a second output line segment 562 formed of a material having the second impedance, wherein a sum of the first impedance and the second impedance is greater than a sum of the impedance of the second transmission line 527 and the third transmission line 528. The first segment 561 can provide a higher impedance path along at least a portion of the first output line 535 for high-frequency currents, such that the first output line 535 has an overall higher impedance than at least one of the second transmission line 527 and the third transmission line 528. For example, a sum of the first impedance and the second impedance can be greater than the impedance of at least one of the second transmission line 527 and the third transmission line 528. In non-limiting aspects, the seventh material 567 can include without limitation any one of aluminum alloy, nickel alloy, iron alloy, etc.

While FIG. 5 depicts, for ease of description and understanding, the first segment 561 as being disposed upstream of the second segment 562, other aspects are not so limited. It is contemplated that various aspects, any number of first segments 561 and second segments 562 can define the first output line 535. It is further contemplated that in non-limiting aspects the first and second segments 561, 562 can be arranged in any desired order or sequence to define the first output line 535 without departing from the scope of the disclosure.

In the non-limiting aspect of FIG. 5, second input line 502 can be formed of the conductive third material 503. In some non-limiting aspects, the third transmission line 528 can also be formed of the third material 503. The second output line 536 can comprise a conductive third segment 563 and a conductive fourth segment 564 connected electrically in series. In an aspect, the conductive third segment 563 can be formed of a conductive eighth material 568, and the conductive fourth segment 564 can be formed of the conductive third material 503. In aspects, the conductive eighth material 568 can be less conductive, or more inductive, or both, than the third material 503. In some aspects, the third material 503 can be the same material as the second material 515, or have the same electrical conductivity as the second material 515, while the eighth material 568 is less electrically conductive, or more inductive, or both than the third material 503. Regardless of the conductive material forming the fourth segment 564, the eighth material 568 forming the third segment 563 can be less electrically conductive, or more inductive, or both, than the material 503 forming the fourth segment 564. In non-limiting aspects, the second output line 536 can comprise the third output line segment 563 formed of the eighth material 568 having a third impedance, and the fourth output line segment 564 formed of a material having a fourth impedance, wherein a sum of the third impedance and the fourth impedance is greater than the total impedance of the second transmission line 527 and the third transmission line 528. For example, in aspects, the second output line 536 can comprise the third output line segment 563 formed of the eighth material 568 having the third impedance, and the fourth output line segment 564 formed of a material having the fourth impedance, wherein a sum of the first impedance, second impedance, third impedance and the fourth impedance is greater than the total impedance of the second transmission line 527 and the third transmission line 528. In non-limiting aspects, the eighth material 568 can include without limitation any one of aluminum alloy, nickel alloy, iron alloy, etc.

While FIG. 5 depicts, for ease of description and understanding, the conductive third segment 563 as being disposed upstream of the conductive fourth segment 564, other aspects are not so limited. It is contemplated that in various aspects, the any desired number of conductive third segments 563 and conductive fourth segments 564 can comprise the second output line 536. It is further contemplated that in non-limiting aspects the conductive third and fourth segments 563, 564 can be arranged in any desired order or sequence to define the second output line 536 without departing from the scope of the disclosure.

In non-limiting aspects, as depicted in FIG. 5, the first current path 510c can comprise a current path extending from the first node 525, and then to the second transmission line 527 to the capacitor C3, then to the third transmission line 528, and then to ground GND. The second current path 520c can comprise another current path extending from the first node 525, and then to the first output line 535 to the load (not shown), then to the second output line 536, and then to ground GND. In non-limiting aspects, due to the lower conductivity (i.e. higher impedance), or greater impedance, or both, of the first material 537, the fourth material 538, or both, (with respect to the respective conductivity or impedance of the second material 515, third material 503 or both) the second current path 520c can define a conductive path having a higher impedance than the impedance of the first current path 510c.

The arrangement and selection of the seventh material 567 and eighth material 568, with respect to the respective conductivity or impedance of the first material 537, second material 515, and third material 503 can serve the particular purpose of configuring the respective relative impedances of the first current path 410c and second current path 420c to direct more of the relatively higher frequency currents (e.g. harmonic frequency currents) to flow through the first current path 410c than the second current path 420c. This can enable the use of smaller, lighter filter components (e.g., inductor L3, capacitor C3) over conventional filter circuits.

Figure 6:
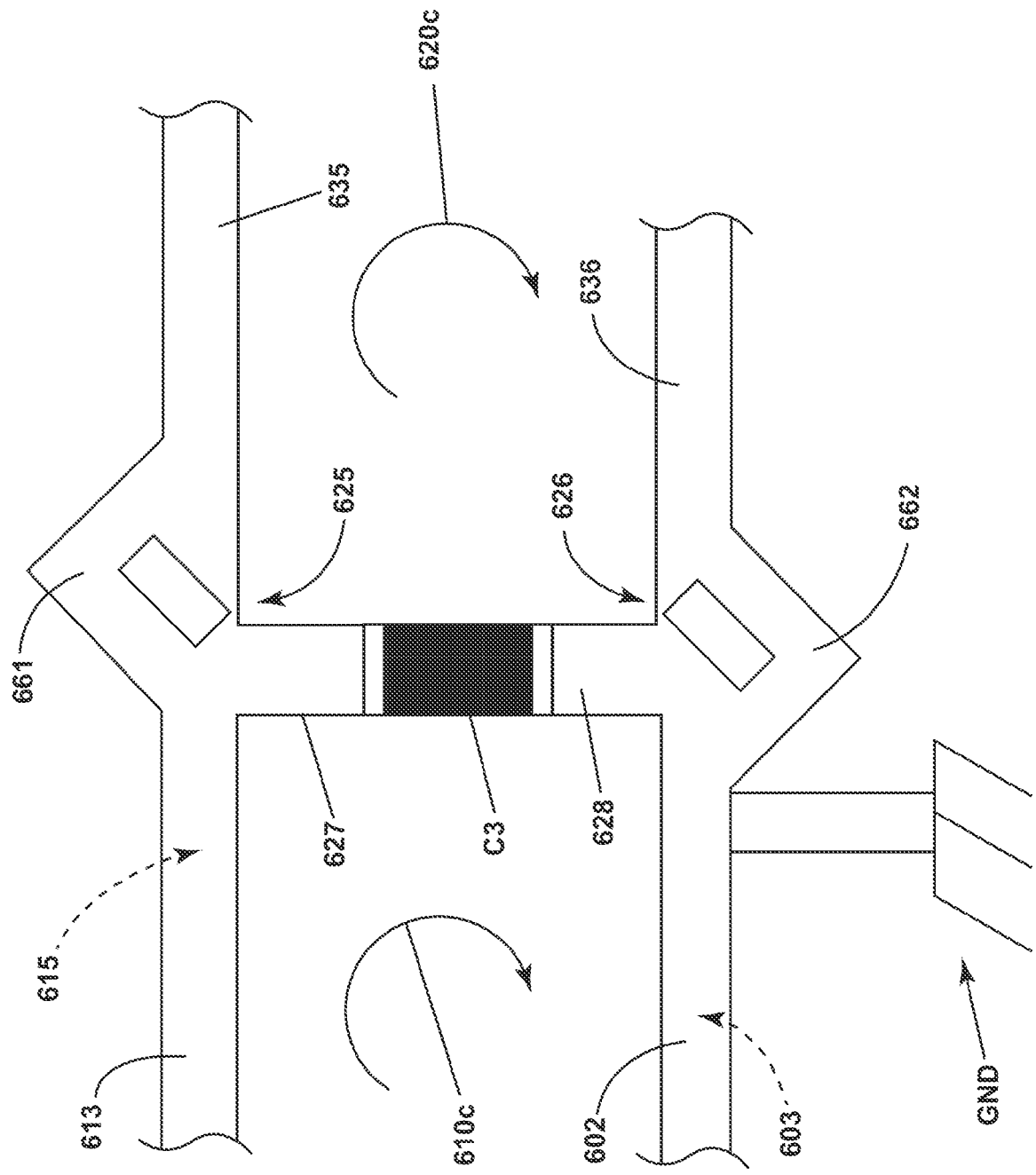
FIG. 6 depicts a portion of yet another non-limiting aspect of the filter circuit of FIG. 3, in accordance with various aspects described herein.

FIG. 6 depicts, in schematic form, another non-limiting aspect of a single phase leg portion of the filter circuit 300 depicted in FIGS. 3 and 3A. It will be appreciated that the description of FIG. 6 would apply mutatis mutandis to the corresponding other phase leg portions of the filter circuit 300. Accordingly, like parts in the schematic illustration of FIG. 6 are identified with the same reference numbers as in FIG. 3A, incremented by 300.

In the non-limiting aspects, as illustrated in FIG. 6, the first transmission line 613 and second transmission line 627 can be formed of the second material 615. The first output line 635 can be coupled to the first transmission line 613 and the second transmission line 627 to define the first node 625. In an aspect, a conductive fourth transmission line 661 can be coupled in series between the first transmission line 613 and the second transmission line 627, in parallel with the first node 625. In this sense, the fourth transmission line 661 can define a segment of the first output line 635. Due to the additional inherent impedance provided by the fourth transmission line 661 to the first output line 635, a higher impedance path is defined compared to the second transmission line 627 such that the first output line 635 and the fourth transmission line 661 have an overall higher impedance than aspects arranged without the fourth transmission line 661. In non-limiting aspects, the first output line 635 and fourth transmission line 661 can be formed of the second material 615.

In other non-limiting aspects, as illustrated in FIG. 6, the second input line 602 and third transmission line 628 can be formed of the third material 603. The second output line 636 can be coupled to the second input line 602 and the third transmission line 628 to define the second node 626. In an aspect, a conductive fifth transmission line 662 can be coupled in series between the second input line 602 and the second output line 636, in parallel with the second node 626. In this sense, the fifth transmission line 662 can define a segment of the second output line 636. Due to the additional inherent impedance provided by the fifth transmission line 662 to the second output line 636, a higher impedance path is defined compared to the second input line 602 such that the second output line 636 and the fifth transmission line 662 have an overall higher impedance than aspects arranged without the fifth transmission line 662. In non-limiting aspects, the second output line 636 and fifth transmission line 662 can be formed of the second material 615.

Figure 7:
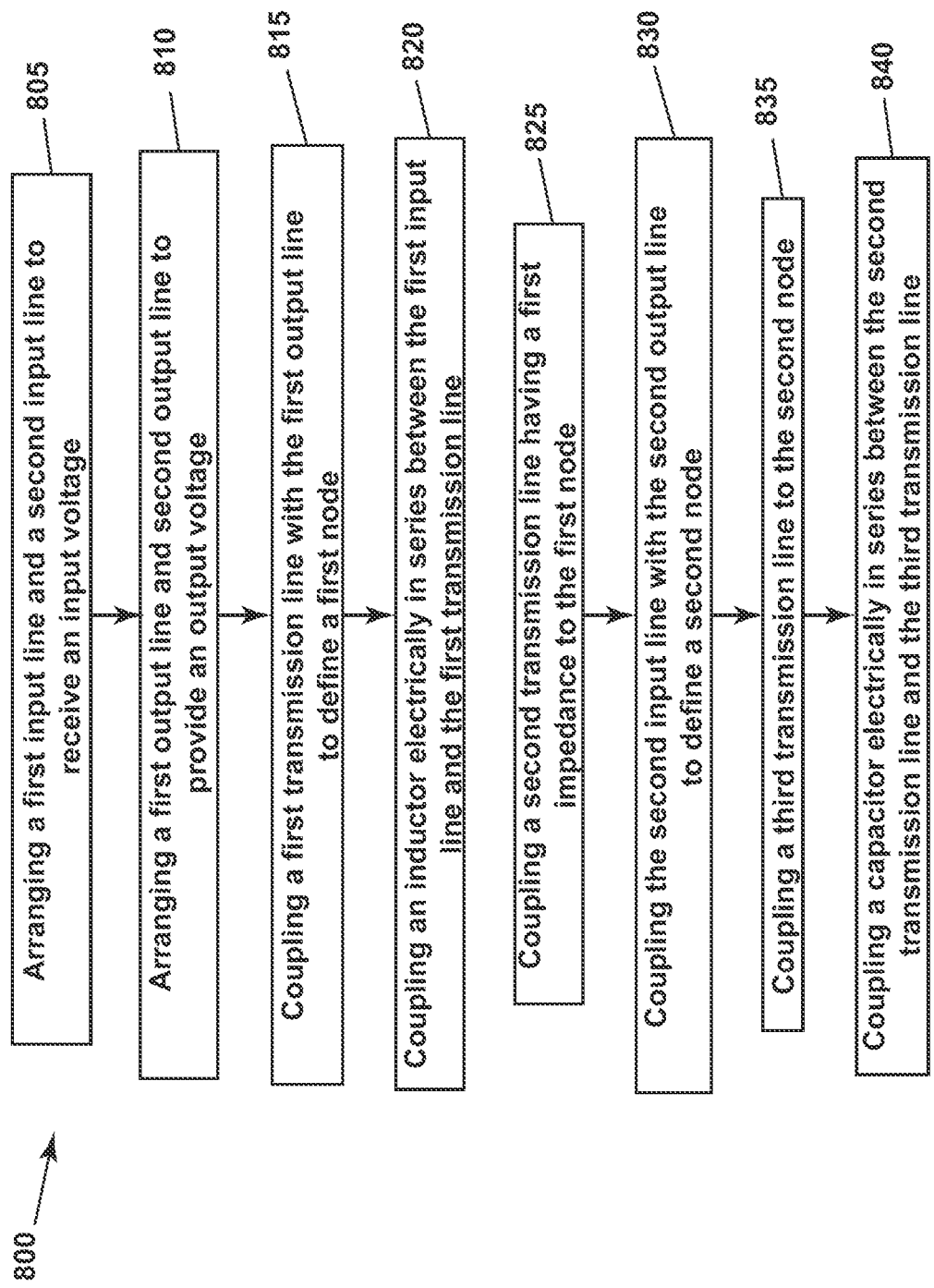
FIG. 7 depicts a method of arranging a filter circuit in accordance with various aspects described herein.

With reference to FIG. 7, the steps for a method 800 of forming an electrical filter circuit is provided. The method 800 can begin at 805 by arranging a respective first input line 301 and a second input line 302 to operatively receive an input voltage Va, Vb, Vc, and at 810, arranging a first output line and a second output line to operatively provide an output voltage Vo. The method 800 can include at 815, coupling a respective first transmission line 313 with each first output line 335 to define a first node 325, and at 820, coupling a respective inductor L electrically in series between each first input line 301 and first transmission line 313. Aspects of the method 800 can further include at 825, coupling a respective second transmission line 327 having a first impedance to each first node 325, and at 830, coupling the second input line 302 with the second output line 336 to define a second node 326. Non-limiting aspects of the method 800 can further include, at 835, coupling a respective third transmission line 328 to each second node; and at 840, coupling a respective capacitor C electrically in series between each second transmission line 327 and third transmission line 328. In non-limiting aspects, the first output line 335 has a second impedance 335a that is greater than the first impedance. Non-limiting aspects of method 800 can further comprise, at 850 coupling each second input line to a ground potential.

In non-limiting aspects, the first output line 335 can be formed of a first material, and the second transmission line 327 can be formed of a second material different than the first material. For example, in some aspects the first material can be less electrically conductive or more inductive, or both, than the second material.

In some non-limiting aspects of the method 800, the third transmission line 328 can be formed of a third material and the second output line can formed of a fourth material different from the third material. For example, in some aspects, the third material can be more electrically conductive, or less inductive, or both, than the fourth material.

In still other aspects of method 800, the first output line can comprise a first material, and a fifth material defining a first layer thereon, wherein the fifth material is less electrically conductive than the first material. Similarly, in non-limiting aspects, the third transmission line can comprise a third material, and the second output line further comprises the third material and a sixth material defining a second layer thereon, wherein the sixth material is less electrically conductive or more inductive, or both than the third material.

It is contemplated that in other non-limiting aspects of method 800 the first output line can comprise a first output line segment having a first impedance, and a second output line segment having a second impedance, wherein the sum of the first impedance and the second impedance is greater than the impedance of the first output line with single segment or same material with first input line.

In still other non-limiting aspects of the method 800 the second output line can comprise a third output line segment having a third impedance, and a fourth output line segment having a fourth impedance, wherein the sum of the third impedance and the fourth impedance is greater than the impedance of the second output line with single segment or same material with second input line.

In still other non-limiting aspects can include at 860, coupling a fifth conductive bus to the first transmission line and the first output line electrically in parallel with the first node. Similarly, other non-limiting aspects can include, at 870, coupling a sixth conductive bus to the second input line and the second output line electrically in parallel with the second node.

While the present disclosure has been described with reference to one or more exemplary aspects, it will be understood by those skilled in the art that various changes can be made and equivalents can be substituted for elements thereof without departing from the scope of the present disclosure. For example, while aspects of a LC filter circuit have been shown with reference to a single-phase and a three-phase AC circuit, other aspects comprising any polyphase AC circuit having any desired number of electrical phases are contemplated. It will be understood that the teachings hereinabove can be applied to other AC circuits having more than three phases by duplicating respective elements corresponding to the additional legs or phases of the AC circuit. In addition, many modifications can be made to adapt a particular situation or material to the teachings of the disclosure without departing from the scope thereof. Therefore, it is intended that the present disclosure not be limited to the particular aspect(s) disclosed as the best mode contemplated for carrying out this disclosure, but that the disclosure will include all aspects falling within the scope of the appended claims.

To the extent not already described, the different features and structures of the various aspects can be used in combination with each other as desired. That one feature cannot be illustrated in all of the aspects is not meant to be construed that it cannot be, but is done for brevity of description. Thus, the various features of the different aspects can be mixed and matched as desired to form new aspects, whether or not the new aspects are expressly described. Combinations or permutations of features described herein are covered by this disclosure.

This written description uses examples to disclose aspects of the disclosure, including the best mode, and also to enable any person skilled in the art to practice aspects of the disclosure, including making and using any devices or systems and performing any incorporated methods. The patentable scope of the disclosure is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

Further aspects of the invention are provided by the subject matter of the following clauses:

An electrical filter circuit comprising: a first input line and a second input line; a first transmission line coupled electrically in series at a first node with a first output line; an inductor coupled electrically in series between the first input line and the first transmission line; a second transmission line having a first impedance coupled to the first node; the second input line coupled electrically in series at a second node with a second output line; a third transmission line coupled to the second node; and a capacitor coupled electrically in series between the second transmission line and the third transmission line; and wherein the first output line has a second impedance that is greater than the first impedance.

The filter circuit of any preceding clause, wherein the first output line is formed of a first material, and the second transmission line is formed of a second material different than the first material.

The filter circuit of any preceding clause, wherein the first material is at least one of less electrically conductive and more inductive than the second material.

The filter circuit of any preceding clause, wherein the third transmission line is formed of a third material and the second output line is formed of a fourth material different from the third material, wherein the third material is at least one of more electrically conductive and less inductive than the fourth material.

The filter circuit of any preceding clause, wherein the first output line comprises a first material, and a fifth material defining a first layer thereon, wherein the fifth material is at least one of less electrically conductive or more inductive than the first material.

The filter circuit of any preceding clause, wherein the third transmission line comprises a third material, and the second output line further comprises the third material, and a sixth material defining a second layer thereon, wherein the sixth material is at least one of less electrically conductive and more inductive than the third material.

The filter circuit of any preceding clause, wherein the first output line comprises a first output line segment formed of a seventh material having a first impedance, and a second output line segment formed of a material having a second impedance, wherein a sum of the first impedance and the second impedance is greater than the total impedance of the second transmission line and the third transmission line.

The filter circuit of any preceding clause, wherein the second output line comprises a third output line segment formed of an eighth material having a third impedance, and a fourth output line segment formed of a material having a fourth impedance, wherein a sum of the first impedance, second impedance, third impedance and the fourth impedance is greater than the total impedance of the second transmission line and third transmission line.

The filter circuit of any preceding clause, further comprising a fifth conductive bus coupling the first input line and the first output line electrically in parallel with the first node.

The filter circuit of any preceding clause, further comprising a sixth conductive bus coupling the second input line and the second output line electrically in parallel with the second node.

A method of forming an electrical filter circuit, comprising arranging a first input line and a second input line to operatively receive an input voltage Vs; arranging a first output line and a second output line to operatively provide an output voltage Vo; coupling a first transmission line with the first output line to define a first node; coupling an inductor electrically in series between the first input line and the first transmission line; coupling a second transmission line having a first impedance to the first node; coupling the second input line with the second output line to define a second node; coupling a third transmission line to the second node; and coupling a capacitor electrically in series between the second transmission line and the third transmission line; wherein the first output line has a second impedance that is greater than the first impedance.

The method of any preceding clause, wherein the first output line is formed of a first material, and the second transmission line is formed of a second material different than the first material.

The method of any preceding clause, wherein the first material is at least one of less electrically conductive and more inductive than the second material.

The method of any preceding clause, wherein the third transmission line is formed of a third material and the second output line is formed of a fourth material different from the third material, wherein the third material is at least one of more electrically conductive and less inductive than the fourth material.

The method of any preceding clause, wherein the first output line comprises a first material, and a fifth material defining a first layer thereon, wherein the fifth material is at least one of less electrically conductive and more inductive than the first material.

The method of any preceding clause, wherein the third transmission line comprises a third material, and the second output line further comprises the third material and a sixth material defining a second layer thereon, wherein the sixth material is at least one of less electrically conductive and more inductive than the third material.

The method of any preceding clause, wherein the first output line comprises a first output line segment having a first impedance, and a second output line segment having a second impedance, wherein a sum of the first impedance and the second impedance is greater than the total impedance of the second transmission line and the third transmission line.

The method of any preceding clause, wherein the second output line comprises a third output line segment formed of a material having a third impedance, and a fourth output line segment formed of a material having a fourth impedance, wherein a sum of the first impedance, second impedance, third impedance and fourth impedance is greater than the total impedance of the second transmission line and the third transmission line.

The method of any preceding clause, further comprising coupling a fifth conductive bus to the first input line and the first output line electrically in parallel with the first node to define a segment of the first output line.

The method of any preceding clause, further comprising coupling a sixth conductive bus to the second input line and the second output line electrically in parallel with the second node to define a segment of the second output line.

What is claimed is:

1. An electrical filter circuit comprising:
    a first input line and a second input line;
    a first transmission line coupled electrically in series at a first node with a first output line comprising a first material;
    an inductor coupled electrically in series between the first input line and the first transmission line;
    a second transmission line comprising a second material different than the first material coupled to the first node;
    the second input line coupled electrically in series at a second node with a second output line;
    a third transmission line coupled to the second node; and
    a capacitor coupled electrically in series between the second transmission line and the third transmission line; and
    wherein an impedance of the first output line is greater than an impedance of the second transmission line.

2. The filter circuit of claim 1, further comprising a sixth conductive bus coupling the second input line and the second output line electrically in parallel with the second node.

3. The filter circuit of claim 1, wherein the first material is at least one of less electrically conductive and more inductive than the second material.

4. The filter circuit of claim 1, wherein the third transmission line is formed of a third material and the second output line is formed of a fourth material different from the third material, wherein the third material is at least one of more electrically conductive and less inductive than the fourth material.

5. The filter circuit of claim 1, wherein the first output line further comprises a fifth material defining a first layer disposed on the first material, wherein the fifth material is at least one of less electrically conductive or more inductive than the first material.

6. The filter circuit of claim 1, wherein the third transmission line comprises a third material, and the second output line further comprises the third material, and a sixth material defining a second layer thereon, wherein the sixth material is at least one of less electrically conductive and more inductive than the third material.

7. The filter circuit of claim 1, wherein the first output line comprises a first output line segment formed of the first material having a first impedance, and a second output line segment formed of a seventh material having a second impedance, wherein a sum of the first impedance and the second impedance is greater than a total impedance of the second transmission line and the third transmission line.

8. The filter circuit of claim 7, wherein the second output line comprises a third output line segment formed of an eighth material having a third impedance, and a fourth output line segment formed of a material having a fourth impedance, wherein a sum of the first impedance, second impedance, third impedance and the fourth impedance is greater than the total impedance of the second transmission line and third transmission line.

9. The filter circuit of claim 1, further comprising a fifth conductive bus coupling the first input line and the first output line electrically in parallel with the first node.

10. A method of forming an electrical filter circuit, comprising:
arranging a first input line and a second input line to operatively receive an input voltage Vs;
arranging a first output line comprising a first material and a second output line to operatively provide an output voltage Vo;
coupling a first transmission line with the first output line to define a first node;
coupling an inductor electrically in series between the first input line and the first transmission line;
coupling a second transmission line comprising a second material different than the first material to the first node;
coupling the second input line with the second output line to define a second node;
coupling a third transmission line to the second node; and
coupling a capacitor electrically in series between the second transmission line and the third transmission line;
wherein an impedance of the first output line is greater than an impedance of the second transmission line.

11. The method of claim 10, further comprising coupling a fifth conductive bus to the first input line and the first output line electrically in parallel with the first node to define a segment of the first output line.

12. The method of claim 10, further comprising coupling a sixth conductive bus to the second input line and the second output line electrically in parallel with the second node.

13. The method of claim 10, wherein the first material is at least one of less electrically conductive and more inductive than the second material.

14. The method of claim 10, wherein the third transmission line is formed of a third material and the second output line is formed of a fourth material different from the third material, wherein the third material is at least one of more electrically conductive and less inductive than the fourth material.

15. The method of claim 10, wherein the first output line further comprises a fifth material defining a first layer disposed on the first material, wherein the fifth material is at least one of less electrically conductive and more inductive than the first material.

16. The method of claim 10, wherein the third transmission line comprises a third material, and the second output line further comprises the third material and a sixth material defining a second layer thereon, wherein the sixth material is at least one of less electrically conductive and more inductive than the third material.

17. The method of claim 10, wherein the first output line comprises a first output line segment formed of the first material having a first impedance, and a second output line segment formed of a seventh material having a second impedance, wherein a sum of the first impedance and the second impedance is greater than a total impedance of the second transmission line and the third transmission line.

18. The method of claim 17, wherein the second output line comprises a third output line segment formed of a material having a third impedance, and a fourth output line segment formed of a material having a fourth impedance, wherein a sum of the first impedance, second impedance, third impedance and fourth impedance is greater than the total impedance of the second transmission line and the third transmission line.

* * * * *